(12) United States Patent
Ju et al.

(10) Patent No.: US 10,242,641 B2
(45) Date of Patent: Mar. 26, 2019

(54) DATA PROCESSING APPARATUS CAPABLE OF PERFORMING OPTIMIZED COMPRESSION FOR COMPRESSED DATA TRANSMISSION OVER MULTIPLE DISPLAY PORTS OF DISPLAY INTERFACE AND RELATED DATA PROCESSING METHOD

(71) Applicant: MEDIATEK INC., Hsin-Chu (TW)

(72) Inventors: Chi-Cheng Ju, Hsinchu (TW); Tsu-Ming Liu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 71 days.

(21) Appl. No.: 15/105,580

(22) PCT Filed: Mar. 18, 2015

(86) PCT No.: PCT/CN2015/074433
§ 371 (c)(1),
(2) Date: Jun. 17, 2016

(87) PCT Pub. No.: WO2015/139628
PCT Pub. Date: Sep. 24, 2015

(65) Prior Publication Data
US 2017/0032761 A1     Feb. 2, 2017

Related U.S. Application Data

(60) Provisional application No. 61/954,667, filed on Mar. 18, 2014.

(51) Int. Cl.
G06K 9/46       (2006.01)
G09G 5/00       (2006.01)
(Continued)

(52) U.S. Cl.
CPC .............. *G09G 5/006* (2013.01); *G06F 3/14* (2013.01); *G06F 3/1415* (2013.01); *G06F 11/00* (2013.01);
(Continued)

(58) Field of Classification Search
None
See application file for complete search history.

(56) References Cited

U.S. PATENT DOCUMENTS 5,864,345 A     1/1999   Wickstrom
5,907,374 A     5/1999   Liu
(Continued)

FOREIGN PATENT DOCUMENTS

CN   101110958 A   1/2008
CN   101237582 A   8/2008
(Continued)

OTHER PUBLICATIONS

"International Search Report" dated Jul. 31, 2015 for International application No. PCT/CN2015/074433, International filed:Mar. 18, 2015.

(Continued)

*Primary Examiner* — Randolph I Chu
(74) *Attorney, Agent, or Firm* — Winston Hsu

(57) ABSTRACT

A data processing apparatus has a first compressor, a second compressor, a first output interface, and a second output interface. The first compressor generates first compressed display data by performing compression upon display data of a first partial region of a frame according to a first compression order. The second compressor generates second compressed display data by performing compression upon display data of a second partial region of the frame according to a second compression order. There is a boundary between the first partial region and the second partial (Continued)

region. In a horizontal direction, the first compression order on one side of the first boundary is opposite to the second compression order on another side of the first boundary. The first and second output interfaces output the first and second compressed display data via a first display port and a second display port of a display interface, respectively.

3 Claims, 12 Drawing Sheets

(51) Int. Cl.
    *H04N 19/00* (2014.01)
    *G06F 11/00* (2006.01)
    *G06F 11/07* (2006.01)
    *G06F 3/14* (2006.01)
    *H04N 19/66* (2014.01)
    *G06F 11/10* (2006.01)
    *H03M 13/00* (2006.01)
    *G09G 5/04* (2006.01)
    *G09G 5/14* (2006.01)
    *H04N 19/436* (2014.01)
    *H04N 19/86* (2014.01)
    *G06F 13/42* (2006.01)
    *H04N 19/426* (2014.01)
    *G06T 1/60* (2006.01)

(52) U.S. Cl.
    CPC ...... *G06F 11/0733* (2013.01); *G06F 11/0793* (2013.01); *G06F 11/10* (2013.01); *G06F 13/4282* (2013.01); *G06T 1/60* (2013.01); *G09G 5/04* (2013.01); *G09G 5/14* (2013.01); *H03M 13/6312* (2013.01); *H04N 19/00* (2013.01); *H04N 19/426* (2014.11); *H04N 19/436* (2014.11); *H04N 19/66* (2014.11); *H04N 19/86* (2014.11); *G09G 2310/0264* (2013.01); *G09G 2320/0606* (2013.01); *G09G 2320/0686* (2013.01); *G09G 2330/021* (2013.01); *G09G 2340/02* (2013.01); *G09G 2360/08* (2013.01); *G09G 2370/00* (2013.01); *Y02D 10/14* (2018.01); *Y02D 10/151* (2018.01)

(56) References Cited

U.S. PATENT DOCUMENTS

| | | | |
|---|---|---|---|
| 5,970,233 | A | 10/1999 | Liu |
| 6,320,907 | B1 | 11/2001 | Pau |
| 6,385,571 | B1 | 5/2002 | Heo |
| 6,389,174 | B1 | 5/2002 | Liu |
| 6,539,120 | B1 | 3/2003 | Sita |
| 2003/0002583 | A1 | 1/2003 | Geerlings |
| 2003/0142864 | A1 | 7/2003 | Bezryadin |
| 2003/0206717 | A1 | 11/2003 | Yogeshwar |
| 2004/0150747 | A1 | 8/2004 | Sita |
| 2008/0170626 | A1 | 7/2008 | Sung |
| 2008/0304709 | A1 | 12/2008 | Huang |
| 2008/0304738 | A1 | 12/2008 | Beilloin |
| 2009/0174811 | A1 | 7/2009 | Sung |
| 2011/0216162 | A1 | 9/2011 | Filippini |
| 2011/0242112 | A1 | 10/2011 | Katayama |
| 2011/0310980 | A1 | 12/2011 | Mathew |
| 2013/0148886 | A1 | 6/2013 | Misawa |
| 2013/0235039 | A1 | 9/2013 | Montag |
| 2013/0243100 | A1 | 9/2013 | Liu |
| 2013/0322515 | A1 | 12/2013 | Tung |
| 2014/0057549 | A1 | 2/2014 | Ling |
| 2014/0098111 | A1 | 4/2014 | Ju |
| 2014/0247983 | A1 | 9/2014 | MacInnis |
| 2015/0156469 | A1 | 6/2015 | Qu |
| 2017/0070743 | A1 | 3/2017 | Zhou |

FOREIGN PATENT DOCUMENTS

| | | |
|---|---|---|
| CN | 101854508 A | 10/2010 |
| CN | 102625106 A | 8/2012 |
| CN | 102655592 A | 9/2012 |
| CN | 102665135 A | 9/2012 |
| CN | 102681812 A | 9/2012 |
| CN | 103167218 A | 6/2013 |
| CN | 103167281 A | 6/2013 |
| CN | 103347163 A | 10/2013 |
| CN | 103428528 A | 12/2013 |
| CN | 103595862 A | 2/2014 |
| EP | 0 517 383 A2 | 12/1992 |
| TW | 201349869 A | 12/2013 |
| WO | 2014056406 A1 | 4/2014 |

OTHER PUBLICATIONS

"International Search Report" dated Jun. 17, 2015 for International application No. PCT/CN2015/074432, International filed:Mar. 18, 2015.

"International Search Report" dated Jul. 22, 2015 for International application No. PCT/CN2015/074448, International filed:Mar. 18, 2015.

"International Search Report" dated Aug. 5, 2015 for International application No. PCT/CN2015/074430, International filed:Mar. 18, 2015.

Richard Lawrence, High-Speed Serial Interface for Mobile Displays, DES4-1, IDW'S 06, Proceedings of The 13th International Display Workshops, vol. 3, XP008130948, Dec. 6-8, 2006, Otsu, Japan.

J. Meehan et al., Multimedia IP architecture trends in the mobile multimedia consumer device, Signal Processing: Image Communication, 2010 Elsevier B.V., XP027080310, pp. 317-324, Jun. 1, 2010.

Pierre De Greef et al., P-49: Integrated DisplayPort TCON Device with Vibrant Picture Quality Features, SID 09 Digest, XP007017408, May 31, 2009, pp. 1275-1278.

(A) Type 1    (B) Type 2

(C) Type 3    (D) Type 4

DATA PROCESSING APPARATUS CAPABLE OF PERFORMING OPTIMIZED COMPRESSION FOR COMPRESSED DATA TRANSMISSION OVER MULTIPLE DISPLAY PORTS OF DISPLAY INTERFACE AND RELATED DATA PROCESSING METHOD

CROSS REFERENCE TO RELATED APPLICATIONS

This application claims the benefit of U.S. provisional application No. 61/954,667, filed on Mar. 18, 2014 and incorporated herein by reference.

TECHNICAL FIELD

The disclosed embodiments of the present invention relate to transmitting display data over a display interface, and more particularly, to a data processing apparatus capable of performing optimized compression for compressed data transmission over multiple display ports of a display interface and a related data processing method.

BACKGROUND

A display interface is disposed between a first chip and a second chip to transmit display data from the first chip to the second chip for further processing. For example, the first chip may be a host application processor, and the second chip may be a driver integrated circuit (IC). The display data may include image data, video data, graphic data, and/or OSD (on-screen display) data. Besides, the display data may be single view data for two-dimensional (2D) display or multiple view data for three-dimensional (3D) display. When a display panel supports a higher display resolution, 2D/3D display with higher resolution can be realized. Hence, the display data transmitted over the display interface would have a larger data size/data rate, which increases the power consumption of the display interface inevitably. If the host application processor and the driver IC are both located at a portable device (e.g., a smartphone) powered by a battery device, the battery life is shortened due to the increased power consumption of the display interface. Thus, there is a need for an innovative design which can effectively reduce the power consumption of the display interface.

SUMMARY

In accordance with exemplary embodiments of the present invention, a data processing apparatus capable of performing optimized compression for compressed data transmission over multiple display ports of a display interface and a related data processing method are proposed.

According to a first aspect of the present invention, an exemplary data processing apparatus is disclosed. The exemplary data processing apparatus includes a first compressor, a second compressor, a first output interface, and a second output interface. The first compressor is arranged to generate a first compressed display data by performing compression upon a display data of a first partial region of a frame according to a first compression order. The second compressor is arranged to generate a second compressed display data by performing compression upon a display data of a second partial region of the frame according to a second compression order, wherein there is a first boundary between the first partial region and the second partial region, and in a horizontal direction, the first compression order on one side of the first boundary is opposite to the second compression order on another side of the first boundary. The first output interface is arranged to pack a first output display data derived from the first compressed display data into a first output bitstream, and output the first output bitstream via a first display port of a display interface. The second output interface is arranged to pack a second output display data derived from the second compressed display data into a second output bitstream, and output the second output bitstream via a second display port of the display interface.

According to a second aspect of the present invention, an exemplary data processing apparatus is disclosed. The exemplary data processing apparatus includes a first input interface, a second input interface, a first de-compressor, a second de-compressor, and a post-processor. The first input interface is arranged to receive a first input bitstream from a first display port of a display interface, and un-pack the first input bitstream into a first input display data corresponding to a first partial region of a reconstructed frame. The second input interface is arranged to receive a second input bitstream from a second display port of the display interface, and un-pack the second input bitstream into a second input display data corresponding to a second partial region of the reconstructed frame. The first de-compressor is arranged to generate a first de-compressed display data by performing decompression upon a first compressed display data according to a transmission order of the first compressed display data, wherein the first compressed display data is derived from the first input display data. The second de-compressor is arranged to generate a second de-compressed display data by performing decompression upon a second compressed display data according to a transmission order of the second compressed display data, wherein the second compressed display data is derived from the second input display data. The post-processor is arranged to perform pixel re-ordering upon the second de-compressed display data to generate a first re-ordered de-compressed display data. There is a boundary between the first partial region and the second partial region, and no pixel re-ordering is performed upon the first de-compressed display data.

According to a third aspect of the present invention, an exemplary data processing apparatus is disclosed. The exemplary data processing apparatus includes a first compressor, a second compressor, a first output interface, and a second output interface. The first compressor is arranged to pre-process a junction area corresponding to a boundary between a first partial region and a second partial region of a frame to generate control information, and perform compression upon a display data of the first partial region of the frame to generate a first compressed display data. The second compressor is arranged to receive the control information from the first compressor via an inter communication between the first compressor and the second compressor, and refer to the received control information to perform compression upon a display data of the second partial region of the frame to generate a second compressed display data. The first output interface is arranged to pack a first output display data derived from the first compressed display data into a first output bitstream, and output the first output bitstream via a first display port of a display interface. The second output interface is arranged to pack a second output display data derived from the second compressed display data into a second output bitstream, and output the second output bitstream via a second display port of the display interface.

According to a fourth aspect of the present invention, an exemplary data processing apparatus is disclosed. The exemplary data processing apparatus includes a pre-processor, a first compressor, a second compressor, a first output interface, and a second output interface. The pre-processor is arranged to perform pre-processing upon a frame to generate a pre-processed frame, wherein the pre-processing includes smoothing a junction area corresponding to a boundary between a first partial region and a second partial region of the frame. The first compressor is arranged to perform compression upon a display data of the first partial region in the pre-processed frame to generate a first compressed display data. The second compressor is arranged to perform compression upon a display data of the second partial region in the pre-processed frame to generate a second compressed display data. The first output interface is arranged to pack a first output display data derived from the first compressed display data into a first output bitstream, and output the first output bitstream via a first display port of a display interface. The second output interface is arranged to pack a second output display data derived from the second compressed display data into a second output bitstream, and output the second output bitstream via a second display port of the display interface.

According to a fifth aspect of the present invention, an exemplary data processing apparatus is disclosed. The exemplary data processing apparatus includes a first input interface, a second input interface, a first de-compressor, a second de-compressor, and a post-processor. The first input interface is arranged to receive a first input bitstream via a first display port of a display interface, and un-pack the first input bitstream into a first input display data corresponding to a first partial region of a reconstructed frame. The second input interface is arranged to receive a second input bitstream via a second display port of the display interface, and un-pack the second input bitstream into a second input display data corresponding to a second partial region of the reconstructed frame. The first de-compressor is arranged to perform decompression upon a first compressed display data derived from the first input display data to generate a first de-compressed display data. The second de-compressor is arranged to perform decompression upon a second compressed display data derived from the second input display data to generate a second de-compressed display data. The post-processor is arranged to perform post-processing upon the reconstructed frame, including at least the first de-compressed display data and the second de-compressed display data, to generate a post-processed frame, wherein the post-processing includes smoothing a junction area corresponding to a boundary between the first partial region and the second partial region of the reconstructed frame.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The concept of the present invention is to apply data compression upon display data and then transmit compressed display data over a display interface. As the data size/data rate of the compressed display data is smaller than that of the original un-compressed display data, the power consumption of the display interface is reduced correspondingly. When a display panel has a high resolution, a display area of the display panel may be divided into a plurality of partial display regions, and the partial display regions may be driven based on compressed display data transmitted through a plurality of display ports of the display interface, respectively. In general, the compression operation used for generating a compressed display data to be transmitted via one display port of a display interface is blind to the compression operations used for generating compressed display data to be transmitted via other display port(s) of the display interface. As a result, junction artifacts may occur on a boundary between adjacent partial display regions. The present invention therefore proposes an innovative compression design to reduce undesired junction artifacts. Further details of the proposed compression design are described as below.

Figure 1:
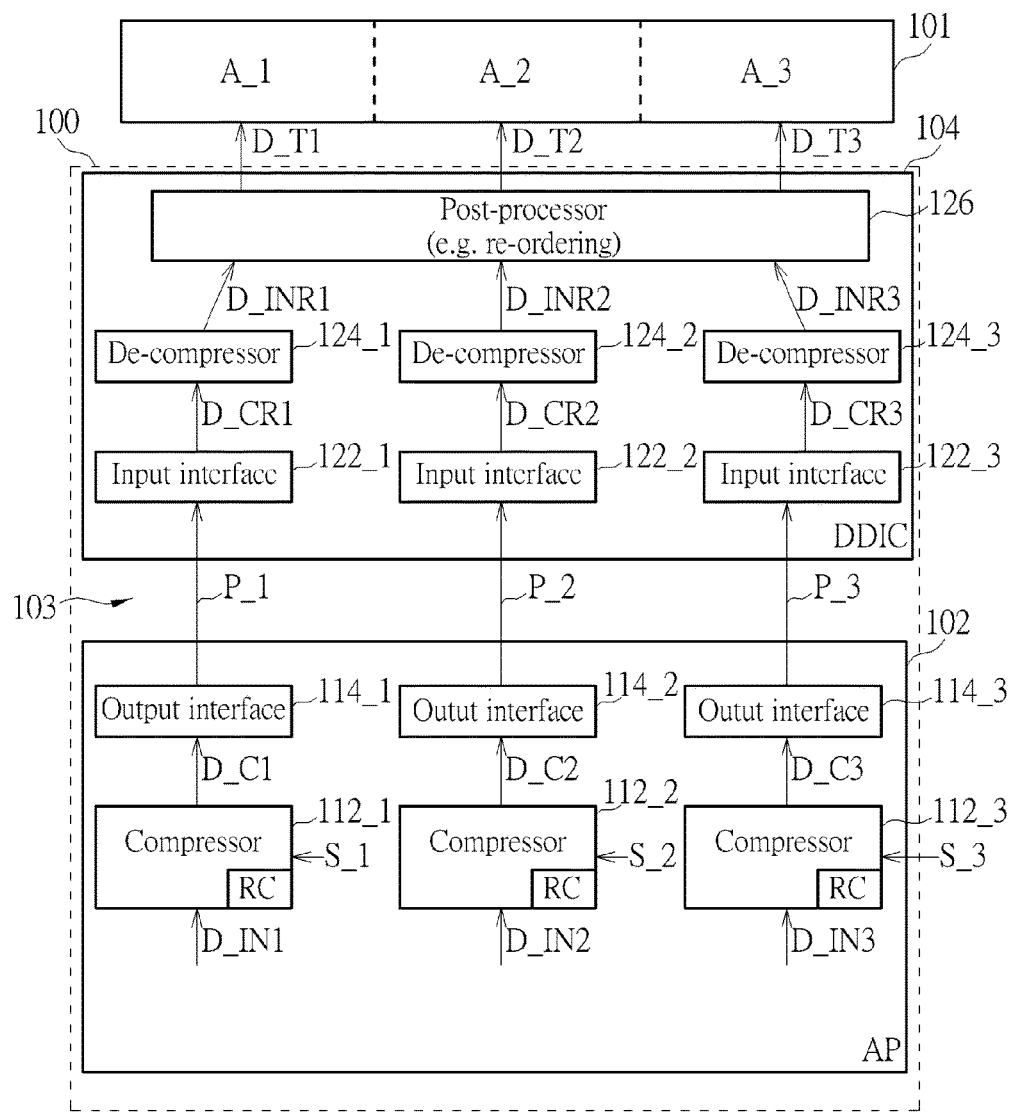
FIG. 1 is a block diagram illustrating a data processing system according to an embodiment of the present invention.

FIG. 1 is a block diagram illustrating a data processing system according to an embodiment of the present invention. The data processing system 100 includes a plurality of data processing apparatuses such as an application processor (AP) 102 and a display driver integrated circuit (DDIC) 104. The AP 102 and the DDIC 104 may be implemented in different chips, and the AP 102 communicates with the DDIC 104 via a display interface 103. In this embodiment, the display interface 103 may be a display serial interface (DSI) standardized by a Mobile Industry Processor Interface (MIPI) or an embedded display port (eDP) standardized by a Video Electronics Standards Association (VESA).

In this embodiment, the display area of a display panel 101 is divided into three partial display regions A_1, A_2, and A_3. Hence, the display interface 103 has three display ports P_1, P_2, and P_3 corresponding to partial display regions A_1, A_2, and A_3 of the display panel 101, respectively. In other words, the AP 102 is coupled to the DDIC 104 through display ports P_1, P_2, and P_3, such that the display data to be displayed on the partial display region A_1 is transmitted via the display port P_1, the display data to be displayed on the partial display region A_2 is transmitted via the display port P_2, and the display data to be displayed on the partial display region A_3 is transmitted via the display port P_3.

In this embodiment, the AP 102 supports display data compression, and the DDIC 104 supports display data decompression. The AP 102 may process three partial display data of each frame separately, where the display data D_IN1 may include one of the three partial display data (i.e., display data of one partial region of a frame), the display data D_IN2 may include another of the three partial display data (i.e., display data of another partial region of the frame), and the display data D_IN3 may include the other of the three partial display data (i.e., display data of the other partial region of the frame). Each of the display data D_IN1-D_IN3 may include image data, video data, graphic data, and/or OSD data. Further, each of the display data D_IN1-D_IN3 may be single view data for 2D display or multiple view data for 3D display.

It should be noted that the configuration shown in FIG. 1 is for illustrative purposes only, and is not meant to be a limitation of the present invention. For example, the number of display ports and the number of partial display regions driven based on compressed display data transmitted through display ports may be adjusted, depending upon actual design consideration.

As shown in FIG. 1, the AP 102 includes a plurality of compressors 112_1, 112_2, 112_3 and a plurality of output interfaces 114_1, 114_2, 114_3. The compressor 112_1 is arranged to generate a compressed display data D_C1 by performing compression upon a display data of one partial region of a frame (e.g., display data D_IN1) according to a compression order S_1. The compressor 112_2 is arranged to generate a compressed display data D_C2 by performing compression upon a display data of another partial region of the frame (e.g., display data D_IN2) according to a compression order S_2. The compressor 112_3 is arranged to generate a compressed display data D_C3 by performing compression upon a display data of the other partial region of the frame (e.g., display data D_IN3) according to a compression order S_3. It should be noted that each of the compressors 112_1-112_3 has a rate controller (RC) used for applying rate control (i.e., bit budget allocation) to the display data compression. Hence, junction artifacts may occur on each boundary between adjacent partial display regions of the display panel 101 if the compression orders (i.e., rate control orders) S_1-S_3 are the same. Specifically, since the rate control is locally optimized in each partial region of a frame rather than the whole region of the frame, rate un-balance may occur in a junction area corresponding to a boundary between adjacent partial regions of the frame, which results in junction artifacts occurring on a boundary between adjacent partial display regions of the display panel 101.

Figure 2:
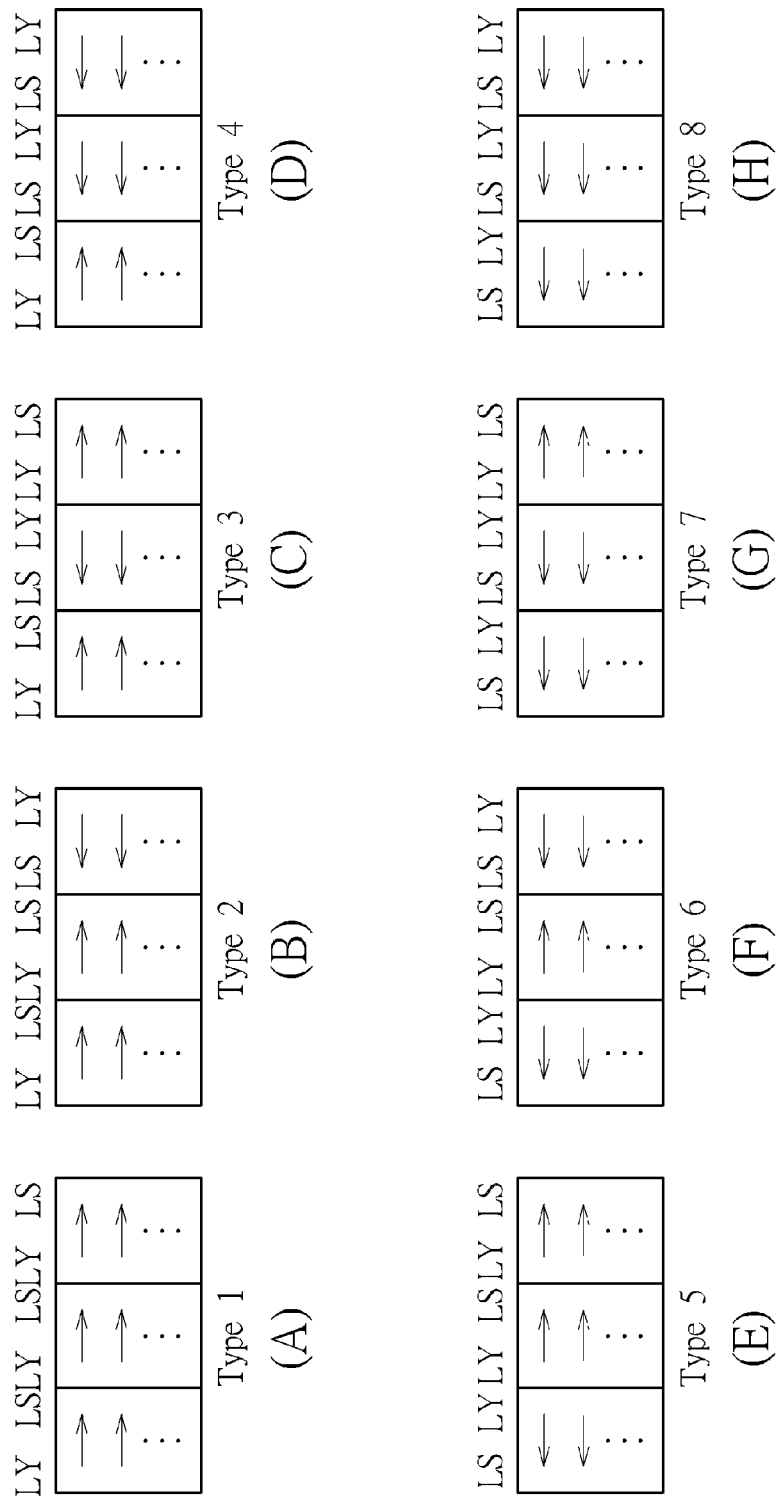
FIG. 2 is a diagram illustrating different types of compression order arrangement according to an embodiment of the present invention.

FIG. 2 is a diagram illustrating different types of compression order arrangement according to an embodiment of the present invention. If the compression order arrangement shown in sub-diagram (A) of FIG. 2 is employed by the AP 102, each of the compression orders S_1-S_3 is set by the same forward compression order "→". In general, the start of compression of one row of compression units tends to be lossy (LY) compression, while the end of compression of one row of compression units tends to be lossless (LS) compression. As a result, the rate un-balance occurs in a junction area corresponding to the boundary between the left partial region and the middle partial region of a frame, and the rate un-balance also occurs in another junction area corresponding to the boundary between the right partial region and the middle partial region of the frame.

If the compression order arrangement shown in sub-diagram (B) of FIG. 2 is employed by the AP 102, each of the compression orders S_1 and S_2 is set by the same forward compression order "→", while the compression order S_3 is set by a backward compression order "←". In a horizontal direction (i.e., a row direction of compression units), the backward compression order is opposite to the forward compression order. Hence, in the horizontal direction, the compression order S_2 on one side of the boundary between the middle partial region and the right partial region of a frame is opposite to the compression order S_3 on the other side of the boundary between the middle partial region and the right partial region of the frame. As a result, there is no rate un-balance occurring in a junction area corresponding to the boundary between the right partial region and the middle partial region of the frame.

If the compression order arrangement shown in sub-diagram (C) of FIG. 2 is employed by the AP 102, there is no rate un-balance occurring in a junction area corresponding to the boundary between the left partial region and the middle partial region of a frame; besides, there is no rate un-balance occurring in another junction area corresponding to the boundary between the middle partial region and the right partial region of the frame.

If the compression order arrangement shown in sub-diagram (D) of FIG. 2 is employed by the AP 102, there is no rate un-balance occurring in a junction area corresponding to the boundary between the left partial region and the middle partial region of a frame.

If the compression order arrangement shown in sub-diagram (E) of FIG. 2 is employed by the AP 102, there is no rate un-balance occurring in a junction area corresponding to the boundary between the left partial region and the middle partial region of a frame.

If the compression order arrangement shown in sub-diagram (F) of FIG. 2 is employed by the AP 102, there is no rate un-balance occurring in a junction area corresponding to the boundary between the left partial region and the middle partial region of a frame; besides, there is no rate un-balance occurring in another junction area corresponding to the boundary between the middle partial region and the right partial region of the frame.

If the compression order arrangement shown in sub-diagram (G) of FIG. 2 is employed by the AP 102, there is no rate un-balance occurring in a junction area corresponding to the boundary between the left partial region and the middle partial region of a frame; besides, there is no rate un-balance occurring in another junction area corresponding to the boundary between the middle partial region and the right partial region of the frame.

If the compression order arrangement shown in sub-diagram (H) of FIG. 2 is employed by the AP 102, the rate un-balance occurs in a junction area corresponding to the boundary between the left partial region and the middle partial region of a frame, and the rate un-balance also occurs in another junction area corresponding to the boundary between the middle partial region and the right partial region of the frame.

As clearly illustrated in FIG. 2, the rate un-balance in a junction area corresponding to a boundary between adjacent partial regions of a frame can be avoided by using opposite compression orders (e.g., one forward compression order "→" and one backward compression order "←"). Based on above observation, the present invention proposes controlling the compression orders S_1-S_3 to avoid/mitigate the undesired junction artifacts. For example, the type-3 compression order arrangement and the type-6 compression order arrangement are optimum compression order arrangements; and the type-2 compression order arrangement, type-4 compression order arrangement, the type-5 compression order arrangement, and the type-7 compression order arrangement are sub-optimum compression order arrangements. Hence, the compression orders S_1-S_3 may be set by one of the type-3 compression order arrangement and the type-6 compression order arrangement for achieving optimum image quality on the display panel 101. Alternatively, the compression orders S_1-S_3 may be set by one of the type-2 compression order arrangement, type-4 compression order arrangement, the type-5 compression order arrangement, and the type-7 compression order arrangement for achieving sub-optimum image quality on the display panel 101.

In this embodiment shown in FIG. 1, the display area of the display panel 101 is divided into three partial display regions A_1-A_3 driven based on display data transmitted through three display ports P_1-P_3. The AP 102 may query the DDIC 104 for determining the number of display ports enabled in the DDIC 104, and then determine a proper compression order arrangement according to the number of display ports enabled in the DDIC 104. Since there are three display ports enabled in the DDIC 104, the AP 102 has three compressors enabled for applying respective data compression upon the display data of three partial regions of one frame, respectively, and employs one of different compression order arrangements shown in FIG. 2. However, this is for illustrative purposes only, and is not meant to be a limitation of the present invention. In an alternative embodiment, the display area of the display panel 101 may be divided into two partial display regions driven based on display data transmitted through two display ports. Hence, the AP 102 may be configured to have two compressors enabled for applying respective data compression upon the display data of two partial regions of one frame, respectively, and may employ one of different compression order arrangements shown in FIG. 3.

Figure 3:
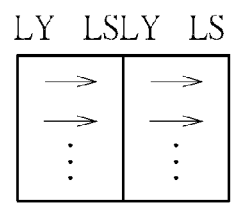
FIG. 3 is a diagram illustrating different types of compression order arrangement according to another embodiment of the present invention.
Figure 3:
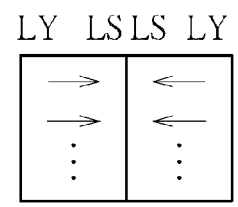
Figure 3:
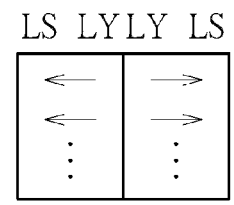
Figure 3:
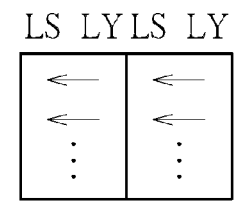

FIG. 3 is a diagram illustrating different types of compression order arrangement according to another embodiment of the present invention. If any of the compression order arrangements shown in sub-diagram (A) and sub-diagram (D) of FIG. 3 is employed by the AP 102, the rate un-balance occurs in a junction area corresponding to a boundary between the left partial region and the right partial region of a frame. If any of the compression order arrangements shown in sub-diagram (B) and sub-diagram (C) of FIG. 3 is employed by the AP 102, there is no rate un-balance occurring in the junction area corresponding to the boundary between the left partial region and the right partial region of the frame. As clearly illustrated in FIG. 3, the rate un-balance in a junction area corresponding to a boundary between adjacent partial regions of a frame can be avoided by using opposite compression orders (e.g., one forward compression order "→" and one backward compression order "←"). Hence, the type-2 compression order arrangement and the type-3 compression order arrangement are optimum compression order arrangements. The compression orders S_1-S_3 may be set by one of the type-2 compression order arrangement and the type-3 compression order arrangement for achieving optimum image quality on the display panel 101.

After the compressed display data D_C1-D_C3 are generated from the compressors 112_1-112_3, respectively, the output interfaces 114_1-114_3 are responsible for transmitting the compressed display data D_C1-D_C3 over the display interface 103, respectively. The output interface 114_1 is arranged to pack a first output display data derived from the compressed display data D_C1 into a first output bitstream, and then output the first output bitstream via the display port P_1 of the display interface 103. The output interface 114_2 is arranged to pack a second output display data derived from the compressed display data D_C2 into a second output bitstream, and then output the second output bitstream via the display port P_2 of the display interface 103. The output interface 114_3 is arranged to pack a third output display data derived from the compressed display data D_C3 into a third output bitstream, and then output the third output bitstream via the display port P_3 of the display interface 103.

The DDIC 104 is used to drive the partial display regions A_1-A_3 of the display panel 101 based on the compressed display data transmitted through the display ports P_1-P_3. In this embodiment, the DDIC 104 includes a plurality of input interfaces 122_1, 122_2, 122_3, a plurality of de-compressors 124_1, 124_2, 124_3, and a post-processor 126. The input interfaces 122_1-122_3 are coupled to display ports P_1-P_3, respectively. The input interface 122_1 is arranged to receive a first input bitstream from the display port P_1 of the display interface 103, and then un-pack the first input bitstream into a first input display data (e.g., a compressed display data D_CR1) corresponding to one partial region of a reconstructed frame. The input interface 122_2 is arranged to receive a second input bitstream from the display port P_2 of the display interface 103, and then un-pack the second input bitstream into a second input display data (e.g., a compressed display data D_CR2) corresponding to another partial region of the reconstructed frame. The input interface 122_3 is arranged to receive a third input bitstream from the display port P_3 of the display interface 103, and then un-pack the third input bitstream into a third input display data (e.g., a compressed display data D_CR3) corresponding to the other partial region of the reconstructed frame. If there is no error occurring during the data transmission over the display interface 103, the compressed display data D_CR1 recovered at the DDIC side should be identical to the compressed display data D_C1 generated at the AP side, the compressed display data D_CR2 recovered at the DDIC side should be identical to the compressed display data D_C2 generated at the AP side, and the compressed display data D_CR3 recovered at the DDIC side should be identical to the compressed display data D_C3 generated at the AP side.

The de-compressor 124_1 is arranged to generate a de-compressed display data D_INR1 (e.g., a de-compressed display data of one partial region of the reconstructed frame) by performing decompression upon the compressed display data D_CR1 according to a transmission order of the compressed display data D_CR2, wherein the compressed display data D_CR1 is derived from the first input display data obtained at the input interface 122_1. The de-compressor 124_2 is arranged to generate a de-compressed display data D_INR2 (e.g., a de-compressed display data of another partial region of the reconstructed frame) by performing decompression upon the compressed display data D_CR2 according to a transmission order of the compressed display data D_CR2, wherein the compressed display data D_CR2 is derived from the second input display data obtained at the input interface 122_2. The de-compressor 124_3 is arranged to generate a de-compressed display data D_INR3 (e.g., a de-compressed display data of the other partial region of the reconstructed frame) by performing decompression upon the compressed display data D_CR3 according to a transmission order of the compressed display data D_CR3, wherein the compressed display data D_CR3 is derived from the third input display data obtained at the input interface 122_3.

When the compression order arrangement employed by the AP 102 includes different compression orders (e.g., forward compression order "→" and backward compression order "←"), a pixel re-ordering operation may be performed upon at least one of the de-compressed display data D_INR1-D_INR3 for obtaining the correct display data of the reconstructed frame. In this embodiment, the post-processor 126 is configured to perform the pixel re-ordering function.

It should be noted that the compression order arrangement employed by the AP 102 may be dynamically adjusted for each frame. In one exemplary design, side information indicative of the compression order arrangement employed by the AP 102 may be transmitted from the AP 102 to the DDIC 104 via an in-band channel (e.g., display interface 103) or an out-of-band channel. Hence, the post-processor 126 can refer to the received side information to know the compression order arrangement employed by the AP 102. In other words, the post-processor 126 refers to the received side information to determine which of the de-compressed display data D_INR1-D_INR3 should undergo pixel re-ordering.

When the de-compressed display data D_INR1 needs pixel re-ordering, the post-processor 126 processes the de-compressed display data D_INR1 to generate a de-compressed display data D_T1 (which is composed of pixel data of re-ordered pixels). However, when the de-compressed display data D_INR1 needs no pixel re-ordering, the post-processor 126 may output the de-compressed display data D_INR1 as the de-compressed display data D_T1 (i.e., D_T1=D_INR1).

When the de-compressed display data D_INR2 needs pixel re-ordering, the post-processor 126 processes the de-compressed display data D_INR2 to generate a de-compressed display data D_T2 (which is composed of pixel data of re-ordered pixels). However, when the de-compressed display data D_INR2 needs no pixel re-ordering, the post-processor 126 may output the de-compressed display data D_INR2 as the de-compressed display data D_T2 (i.e., D_T2=D_INR2).

When the de-compressed display data D_INR3 needs pixel re-ordering, the post-processor 126 processes the de-compressed display data D_INR3 to generate a de-compressed display data D_T3 (which is composed of pixel data of re-ordered pixels). However, when the de-compressed display data D_INR3 needs no pixel re-ordering, the post-processor 126 may output the de-compressed display data D_INR3 as the de-compressed display data D_T3 (i.e., D_T3=D_INR3).

Figure 4:
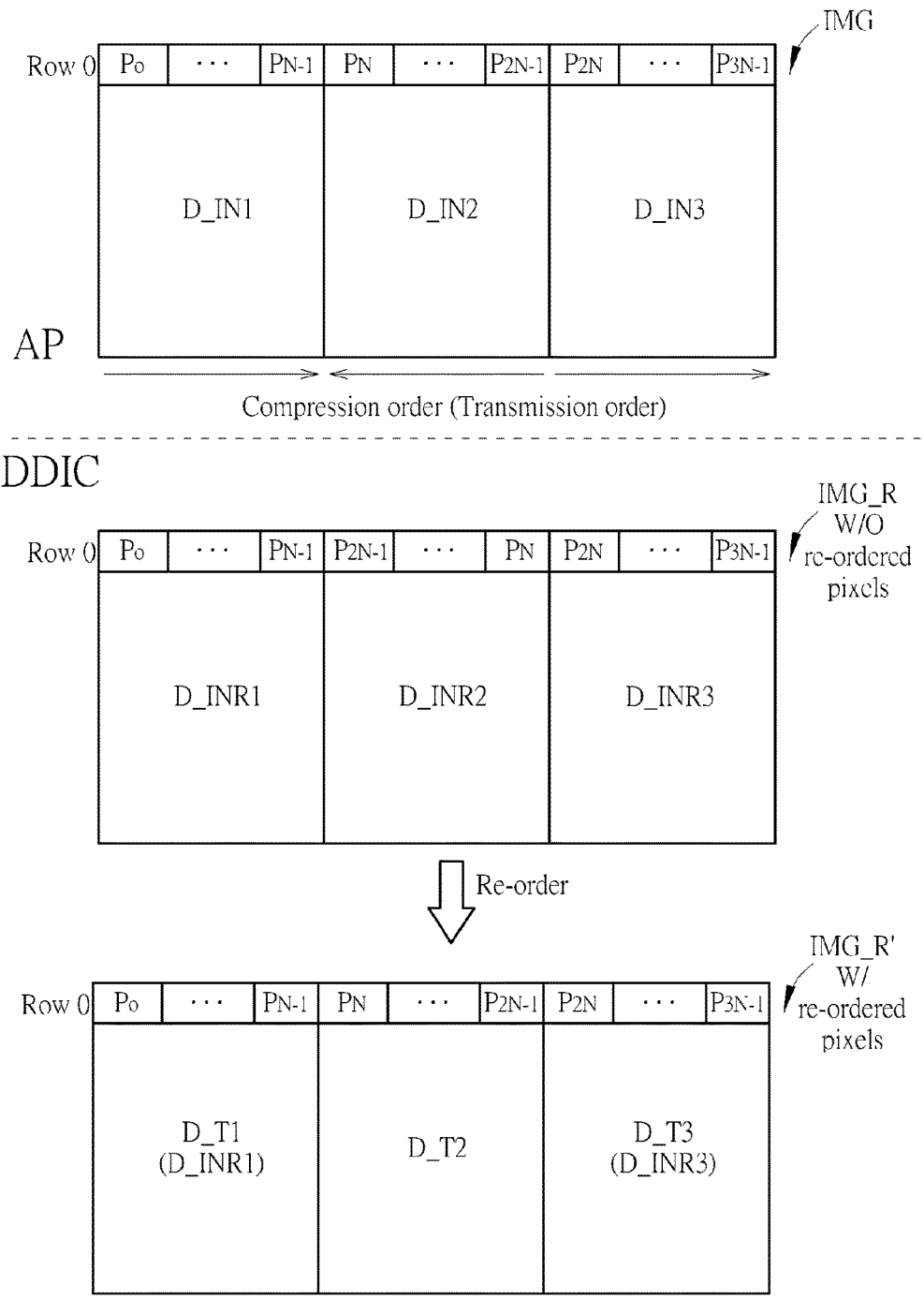
FIG. 4 is a diagram illustrating an example of the pixel re-ordering function performed by a post-processor shown in FIG. 1.

FIG. 4 is a diagram illustrating an example of the pixel re-ordering function performed by the post-processor 126 shown in FIG. 1. At the AP side, an input frame IMG has the display data D_IN1-D_IN3 corresponding to different partial regions. For clarity and simplicity, only pixels located at one pixel row are shown in FIG. 4. With regard to the left partial region of the input frame IMG, there are pixels $P_0$-$P_{N-1}$ located at row 0. With regard to the middle partial region of the input frame IMG, there are pixels $P_N$-$P_{2N-1}$ located at row 0. With regard to the right partial region of the input frame IMG, there are pixels $P_{2N}$-$P_{3N-1}$ located at row 0. The suffix K of each pixel symbol $P_K$ indicates the pixel order. In this example, the type-3 compression order arrangement shown in sub-diagram (C) of FIG. 2 is employed by the AP 102. It should be noted that the compression order also defines a transmission order of the compressed data generated from the compressor.

At the DDIC side, a reconstructed frame IMG_R has the de-compressed display data D_INR1-D_INR3 corresponding to different partial regions. With regard to the left partial region of the reconstructed frame IMG_R, there are pixels $P_0$-$P_{N-1}$ located at row 0. With regard to the middle partial region of the reconstructed frame IMG_R, there are pixels $P_{2N-1}$-$P_N$ located at row 0. With regard to the right partial region of the reconstructed frame IMG_R, there are pixels $P_{2N}$-$P_{3N-1}$ located at row 0. As can be seen from FIG. 4, a sequence order of pixels $P_0$-$P_{N-1}$ within the left partial region of the reconstructed frame IMG_R is identical to a sequence order of pixels $P_0$-$P_{N-1}$ within the left partial region of the input frame IMG, and a sequence order of pixels $P_{2N}$-$P_{3N-1}$ within the right partial region of the reconstructed frame IMG_R is identical to a sequence order of pixels $P_{2N}$-$P_{3N-1}$ within the right partial region of the input frame IMG. However, a sequence order of pixels $P_{2N-1}$-$P_N$ within the middle partial region of the reconstructed frame IMG_R is opposite to a sequence order of pixels $P_N$-$P_{2N-1}$ within the middle partial region of the input frame IMG. Hence, the post-processor 126 applies pixel re-ordering to the de-compressed display data D_INR2 only. In this way, a sequence order of pixels $P_N$-$P_{2N-1}$ within the middle partial region of a final reconstructed frame IMG_R' is identical to the sequence order of pixels $P_N$-$P_{2N-1}$ within the middle partial region of the input frame IMG.

Figure 5:
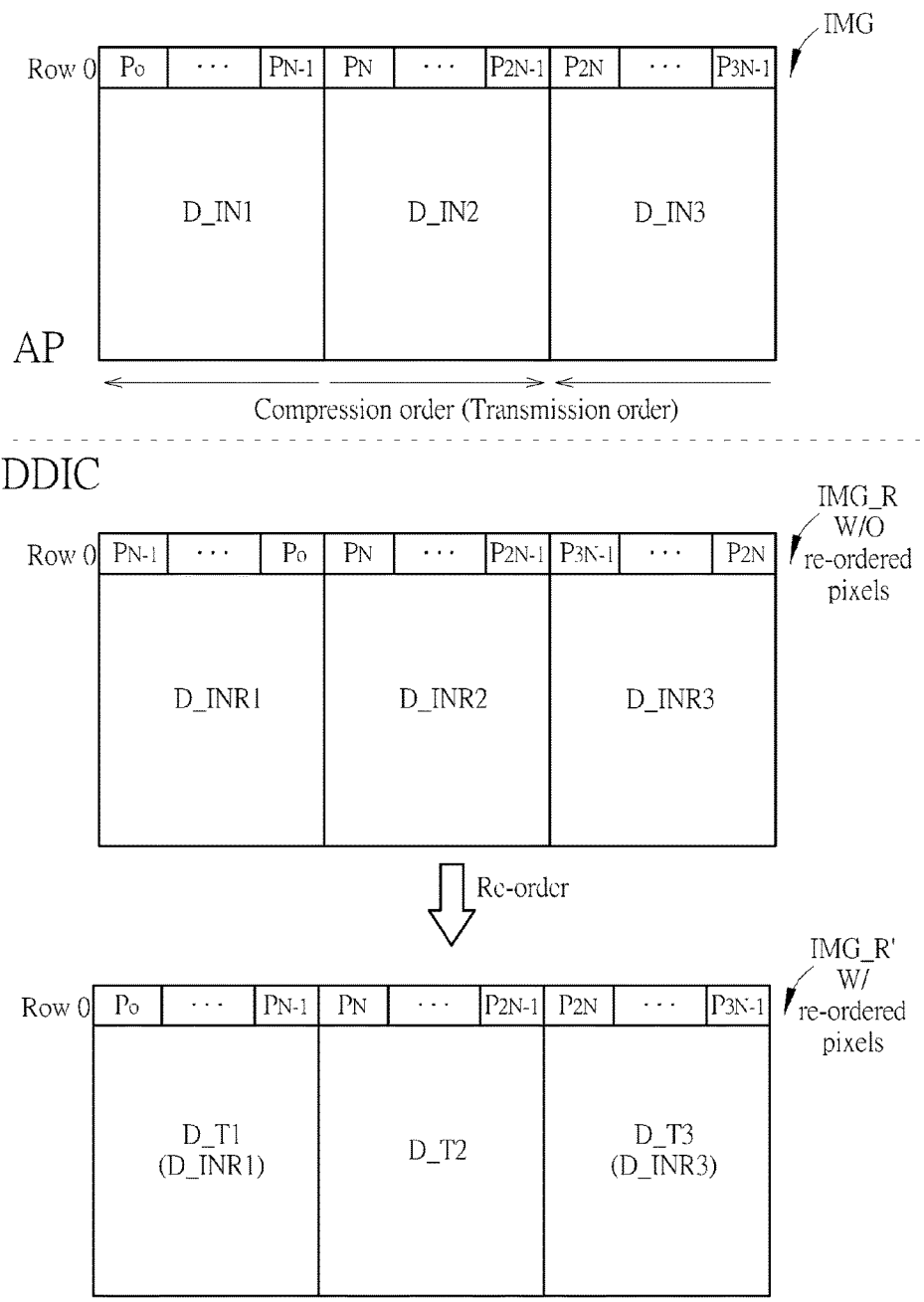
FIG. 5 is a diagram illustrating another example of the pixel re-ordering function performed by the post-processor shown in FIG. 1.

FIG. 5 is a diagram illustrating another example of the pixel re-ordering function performed by the post-processor 126 shown in FIG. 1. In this embodiment, the type-6 compression order arrangement shown in sub-diagram (F) of FIG. 2 is employed by the AP 102. It should be noted that the compression order also defines a transmission order of the compressed data generated from the compressor.

At the DDIC side, a reconstructed frame IMG_R has the de-compressed display data D_INR1-D_INR3 corresponding to different partial regions. With regard to the left partial region of the reconstructed frame IMG_R, there are pixels $P_{N-1}$-$P_0$ located at row 0. With regard to the middle partial region of the reconstructed frame IMG_R, there are pixels $P_N$-$P_{2N-1}$ located at row 0. With regard to the right partial region of the reconstructed frame IMG_R, there are pixels $P_{3N-1}$-$P_{2N}$ located at row 0. As can be seen from FIG. 5, a sequence order of pixels $P_N$-$P_{2N-1}$ within the middle partial region of the reconstructed frame IMG_R is identical to a sequence order of pixels $P_N$-$P_{2N-1}$ within the middle partial region of the input frame IMG. However, a sequence order of pixels $P_{N-1}$-$P_0$ within the left partial region of the reconstructed frame IMG_R is opposite to a sequence order of pixels $P_0$-$P_{N-1}$ within the left partial region of the input frame IMG, and a sequence order of pixels $P_{3N-1}$-$P_{2N}$ within the right partial region of the reconstructed frame IMG_R is opposite to a sequence order of pixels $P_{2N}$-$P_{3N-1}$ within the right partial region of the input frame IMG. Hence, the post-processor 126 applies pixel re-ordering to the de-compressed display data D_INR1 and D_INR3 only. In this way, a sequence order of pixels $P_0$-$P_{N-1}$ within the left partial region of a final reconstructed frame IMG_R' is identical to the sequence order of pixels $P_0$-$P_{N-1}$ within the left partial region of the input frame IMG, and a sequence order of pixels $P_{2N}$-$P_{3N-1}$ within the right partial region of the final reconstructed frame IMG_R' is identical to the sequence order of pixels $P_{2N}$-$P_{3N-1}$ within the right partial region of the input frame IMG.

Figure 6:
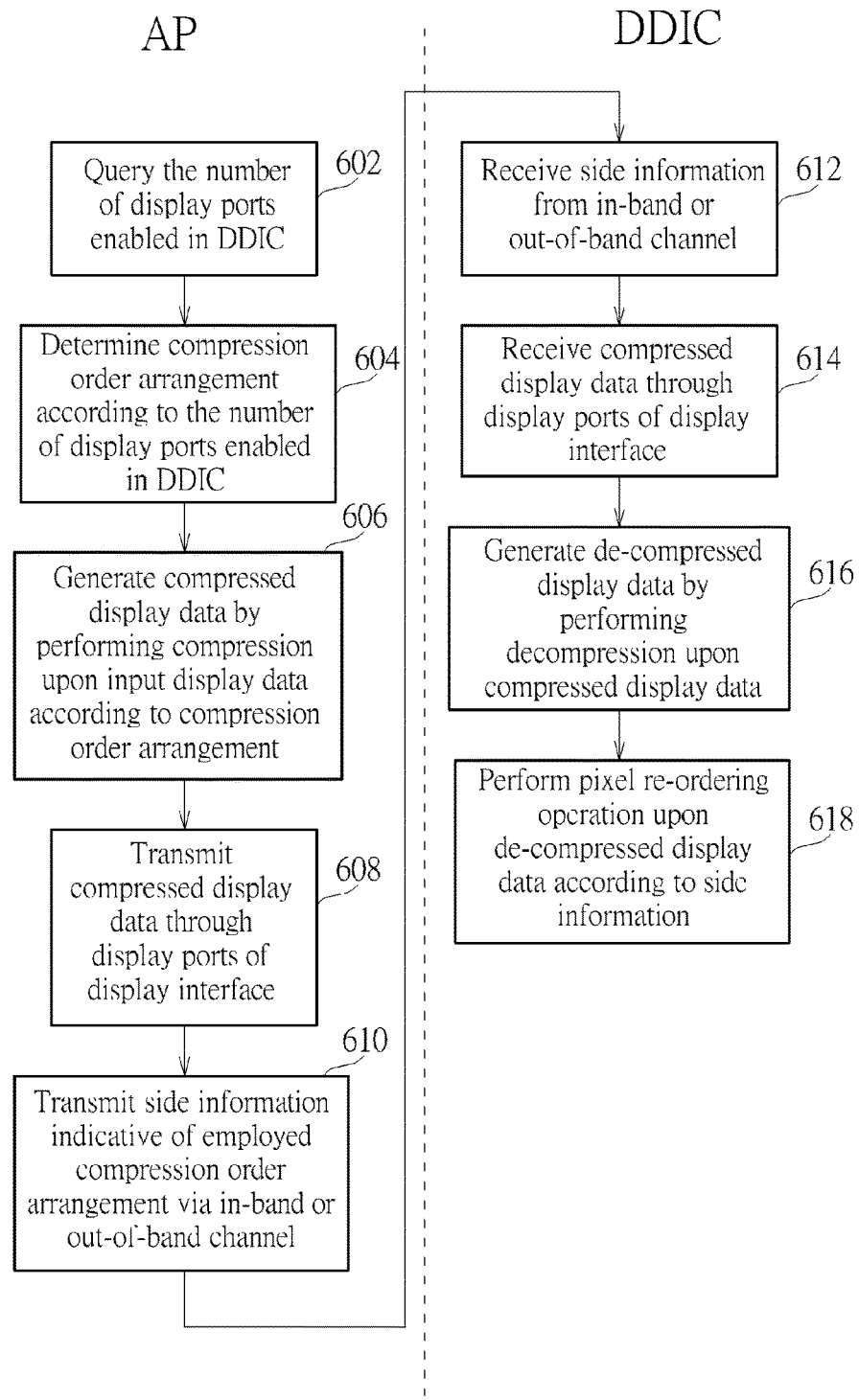
FIG. 6 is a flowchart illustrating a data processing method according to an embodiment of the present invention.

FIG. 6 is a flowchart illustrating a data processing method according to an embodiment of the present invention. Provided that the result is substantially the same, the steps are not required to be executed in the exact order shown in FIG. 6. The data processing method may be employed by the data processing system 100 shown in FIG. 1, and may be briefly summarized as below.

Step 602: Query a DDIC for determining the number of display ports enabled in the DDIC.

Step 604: Determine a compression order arrangement according to the number of display ports enabled in the DDIC.

Step 606: Generate a plurality of compressed display data by performing compression upon a plurality of input display data according to the compression order arrangement.

Step 608: Transmit the plurality of compressed display data through a plurality of display ports of a display interface, respectively.

Step 610: Transmit side information indicative of the employed compression order arrangement via an in-band channel or an out-of-band channel.

Step 612: Receive the side information from the in-band channel or the out-of-band channel.

Step 614: Receive a plurality of compressed display data through the display ports of the display interface, respectively.

Step 616: Generate a plurality of de-compressed display data by performing decompression upon the plurality of compressed display data, respectively.

Step 618: Perform a pixel re-ordering operation upon at least one of the plurality of de-compressed display data according to the received side information.

Steps 602-610 are performed at the AP side (i.e., the encoder side), and steps 612-618 are performed at the DDIC side (i.e., the decoder side). As a person skilled in the art can readily understand details of each step shown in FIG. 6 after reading above paragraphs, further description is omitted here for brevity.

In a case where the compression operation used for generating a compressed display data to be transmitted via one display port of a display interface is blind to the compression operations used for generating compressed display data to be transmitted via other display port(s) of the display interface, junction artifacts may occur on the boundary between adjacent partial display regions of a display panel. To reduce the undesired junction artifacts, the present invention further proposes exchanging compression-related information among different compressors implemented in an application processor.

Figure 7:
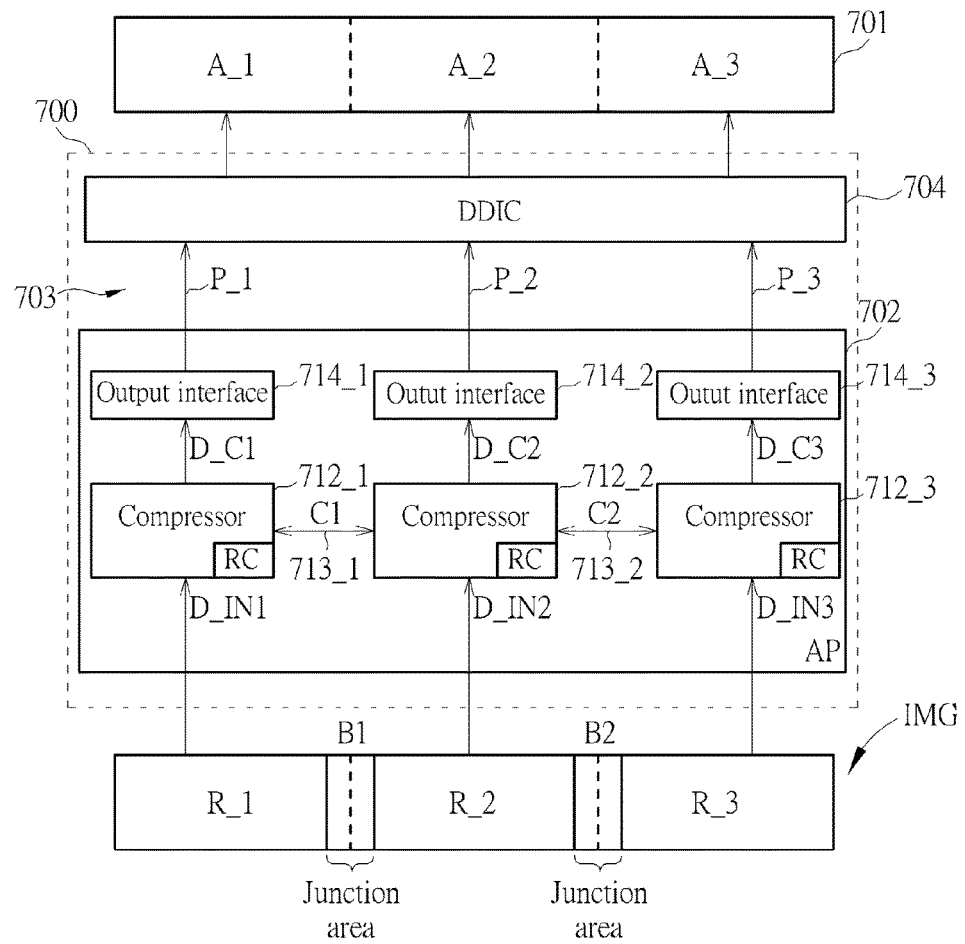
FIG. 7 is a block diagram illustrating another data processing system according to an embodiment of the present invention.

FIG. 7 is a block diagram illustrating another data processing system according to an embodiment of the present invention. The data processing system 700 includes a plurality of data processing apparatuses such as an application processor (AP) 702 and a display driver integrated circuit (DDIC) 704. The AP 702 and the DDIC 704 may be implemented in different chips, and the AP 702 communicates with the DDIC 704 via a display interface 703. In this embodiment, the display interface 703 may be a display serial interface (DSI) standardized by a Mobile Industry Processor Interface (MIPI) or an embedded display port (eDP) standardized by a Video Electronics Standards Association (VESA).

In this embodiment, the display area of a display panel 701 is divided into three partial display regions A_1, A_2, and A_3. Hence, the display interface 703 has three display ports P_1, P_2, and P_3 corresponding to partial display regions A_1, A_2, and A_3 of the display panel 701, respectively. In other words, the AP 702 is coupled to the DDIC 704 through display ports P1, P_2, and P_3, such that the display data to be displayed on the partial display region A_1 is transmitted via the display port P_1, the display data to be displayed on the partial display region A_2 is transmitted via the display port P_2, and the display data to be displayed on the partial display region A_3 is transmitted via the display port P_3.

In this embodiment, the AP 702 supports display data compression, and the DDIC 704 supports display data decompression. The AP 702 may query the DDIC 704 for determining the number of display ports enabled in the DDIC 704, and then determine locations and sizes of partial regions in an input frame IMG. Since there are three display ports enabled in the DDIC 104, the AP 102 has three compressors enabled for applying respective data compression upon the display data of three partial regions of one frame, respectively. For example, the display data D_IN1 may include the display data of one partial region R_1 of an input frame IMG, the display data D_IN2 may include the display data of another partial region R_2 of the input frame IMG, and the display data D_IN3 may include the display data of the other partial region R_3 of the input frame IMG. Each of the display data D_IN1-D_IN3 may include image data, video data, graphic data, and/or OSD data. Further, each of the display data D_IN1-D_IN3 may be single view data for 2D display or multiple view data for 3D display.

It should be noted that the configuration shown in FIG. 7 is for illustrative purposes only, and is not meant to be a limitation of the present invention. For example, the number of display ports and the number of partial display regions driven based on compressed display data transmitted through display ports may be adjusted, depending upon actual design consideration.

As shown in FIG. 7, the AP 702 includes a plurality of compressors 712_1, 712_2, 712_3 and a plurality of output interfaces 714_1, 714_2, 714_3. In this embodiment, the compressors 712_1-712_3 can communicate with one another via the inner communication 713_1 and 713_2. In addition, one compressor acts as a master compressor, and the remaining compressors act as slave compressors. For example, the compressor 712_2 may be configured to act as a master compressor, and each of the compressors 712_1 and 712_3 is configured to act as a slave compressor. It should be noted that each of the compressors 712_1-712_3 has a rate controller (RC) used for applying rate control (i.e., bit budget allocation) to the display data compression.

The master compressor (e.g., compressor 712_2) is arranged to pre-process a junction area corresponding to one boundary B1 between adjacent partial regions R_1 and R_2 of the input frame IMG to generate one control information C1, and further pre-process a junction area corresponding to another boundary B2 between adjacent partial regions R_2 and R_3 of the input frame IMG to generate another control information C2. Thanks to the inter communication 713_1 and 713_2, the control information C1 is transmitted from the master compressor (e.g., compressor 712_2) to one slave compressor (e.g., compressor 712_1), and the control information C2 is transmitted from the master compressor (e.g., compressor 712_2) to the other slave compressor (e.g., compressor 712_3). Moreover, the master compressor (e.g., compressor 712_2) is arranged to perform compression upon the display data D_IN2 to generate a compressed display data D_C2.

The slave compressor (e.g., compressor 712_1) is arranged to receive the control information C1 via the inter communication 713_1 between the slave compressor (e.g., compressor 712_1) and the master compressor (e.g., compressor 712_2), and refer to the received control information C1 to perform compression upon the display data D_IN1 to generate a compressed display data D_C1. The slave compressor (e.g., compressor 712_1) can use the control information C1 provided by the master compressor (e.g., compressor 712_2) to improve the compression quality of the compressed display data D_C1.

In one exemplary design, the control information C1 may include a display data of the junction area corresponding to the boundary B1 between the partial regions R_1 and R_2 of the input frame IMG. Since the display data of the junction area includes additional pixel data not within the partial region R_1 (i.e., information of pixels that art located in the partial region R_2 and are close to the boundary B1), the condition around the boundary B1 can be known from the display data of the associated junction area. In this way, the rate control applied to compression of pixels located in the partial region R_1 and close to the boundary B1 can be properly set based on the display data of the junction area, thus leading to improved compression quality.

In another exemplary design, the control information C1 may include a bit budget in the junction area corresponding to the boundary B1 between the partial regions R_1 and R_2 of the input frame IMG. Since the master compressor (e.g., compressor 712_2) is aware of the condition around the boundary B1 through a pre-processing result of the input frame IMG, an optimized bit budget in the junction area corresponding to the boundary B1 may be determined by the master compressor (e.g., compressor 712_2) and then supplied to the slave compressor (e.g., compressor 712_1).

Similarly, the slave compressor (e.g., compressor 712_3) is arranged to receive the control information C2 via the inter communication 713_2 between the slave compressor (e.g., compressor 712_3) and the master compressor (e.g., compressor 712_2), and refer to the received control information C2 to perform compression upon the display data D_IN3 to generate a compressed display data D_C3. The slave compressor (e.g., compressor 712_3) can use the control information C2 provided by the master compressor (e.g., compressor 712_2) to improve the compression quality of the compressed display data D_C3.

In one exemplary design, the control information C2 may include a display data of the junction area corresponding to the boundary B2 between the partial regions R_2 and R_3 of the input frame IMG. Since the display data of the junction area includes additional pixel data not within the partial region R_3 (i.e., information of pixels that are located in the partial region R_2 and are close to the boundary B2), the condition around the boundary B2 can be known from the display data of the associated junction area. In this way, the rate control applied to compression of pixels located in the partial region R_3 and close to the boundary B2 can be properly set based on the display data of the junction area, thus leading to improved compression quality.

In another exemplary design, the control information C2 may include a bit budget in the junction area corresponding to the boundary B2 between the partial regions R_2 and R_3 of the input frame IMG. Since the master compressor (e.g., compressor 712_2) is aware of the condition around the boundary B2 through a pre-processing result of the input frame IMG, an optimized bit budget in the junction area corresponding to the boundary B2 may be determined by the master compressor (e.g., compressor 712_2) and then supplied to the slave compressor (e.g., compressor 712_3).

After the compressed display data D_C1-D_C3 are generated from the compressors 712_1-712_3, respectively, the output interfaces 714_1-714_3 are responsible for transmitting the compressed display data D_C1-D_C3 over the display interface 703, respectively. The output interface 714_1 is arranged to pack a first output display data derived from the compressed display data D_C1 into a first output bitstream, and output the first output bitstream via the display port P_1 of the display interface 103. The output interface 714_2 is arranged to pack a second output display data derived from the compressed display data D_C2 into a second output bitstream, and output the second output bitstream via the display port P_2 of the display interface 703. The output interface 714_3 is arranged to pack a third output display data derived from the compressed display data D_C3 into a third output bitstream, and output the third output bitstream via the display port P_3 of the display interface 703. After receiving bitstreams (which carry the compressed display data) from the display interface 703, the DDIC 704 is operative to drive the partial display regions A_1-A_3 of the display panel 101 based on de-compressed display data obtained by applying decompression to the compressed display data.

In one exemplary design, side information indicative of inter communication results between the master compressor and the slave compressor(s) may be transmitted from the AP 702 to the DDIC 704 via an in-band channel (e.g., display interface 703) or an out-of-band channel. Hence, the DDIC 704 can refer to the received side information to know display data compression settings used by the AP 702. In other words, the DDIC 704 can refer to the received side information to properly configure the display data decompression performed at the DDIC side.

Figure 8:
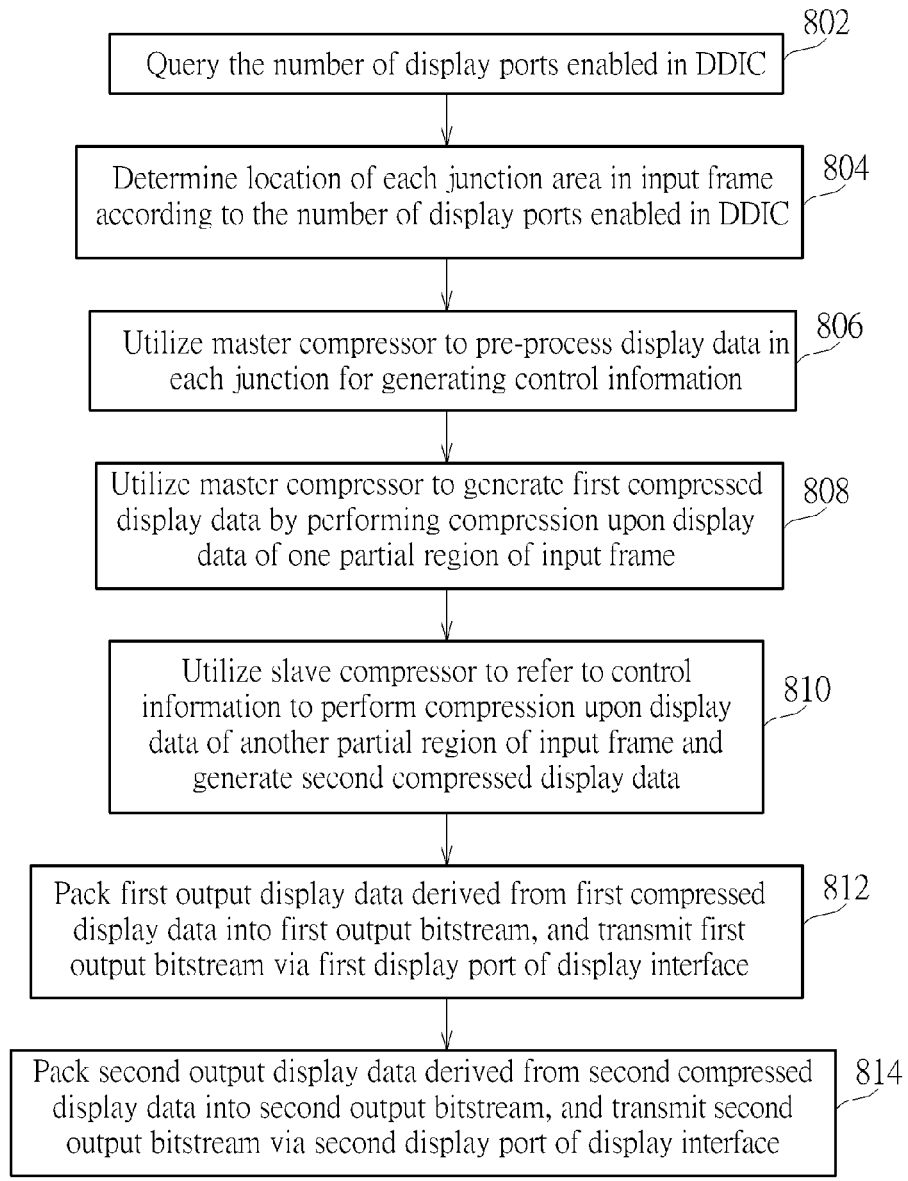
FIG. 8 is a flowchart illustrating another data processing method according to an embodiment of the present invention.

FIG. 8 is a flowchart illustrating another data processing method according to an embodiment of the present invention. Provided that the result is substantially the same, the steps are not required to be executed in the exact order shown in FIG. 8. The data processing method may be employed by the AP 702 shown in FIG. 7, and may be briefly summarized as below.

Step 802: Query a DDIC for determining the number of display ports enabled in the DDIC.

Step 804: Determine the location of each junction area in an input frame according to the number of display ports enabled in the DDIC.

Step 806: Utilize a master compressor to pre-process a display data in each junction area, and generate control information according to a pre-processing result of each junction area.

Step 808: Utilize the master compressor to generate a first compressed display data by performing compression upon a display data of one partial region of the input frame.

Step 810: Utilize a slave compressor to refer to the control information received from the master compressor to perform compression upon a display data of another partial region of the input frame for generating a second compressed display data.

Step 812: Pack a first output display data derived from the first compressed display data into a first output bitstream, and output the first output bitstream via a first display port of a display interface.

Step 814: Pack a second output display data derived from the second compressed display data into a second output bitstream, and output the second output bitstream via a second display port of a display interface.

As a person skilled in the art can readily understand details of each step shown in FIG. 8 after reading above paragraphs, further description is omitted here for brevity.

To reduce the undesired junction artifacts, the present invention further proposes using a pre-processor for applying pre-smoothing to an input frame at an AP side and/or a post-processor for applying post-smoothing to a reconstructed frame at a DDIC side.

Figure 9:
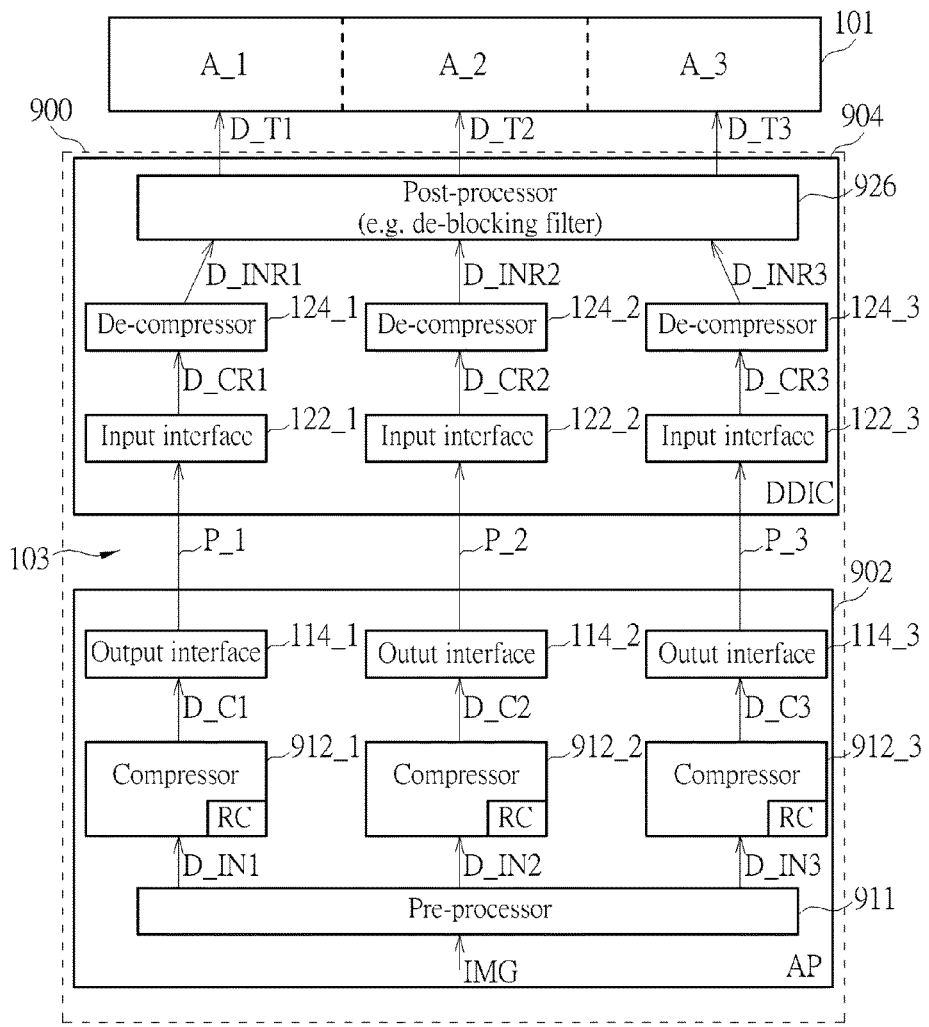
FIG. 9 is a block diagram illustrating yet another data processing system according to an embodiment of the present invention.

FIG. 9 is a block diagram illustrating yet another data processing system according to an embodiment of the present invention. The data processing system 900 includes a plurality of data processing apparatuses such as an application processor (AP) 902 and a display driver integrated circuit (DDIC) 904. The AP 902 and the DDIC 904 may be implemented in different chips, and the AP 902 communicates with the DDIC 904 via the display interface 103. In this embodiment, the display interface 103 may be a display serial interface (DSI) standardized by a Mobile Industry Processor Interface (MIPI) or an embedded display port (eDP) standardized by a Video Electronics Standards Association (VESA).

The configuration of the data processing system 900 shown in FIG. 9 is similar to that of the data processing system 100 shown in FIG. 1. The major difference between the data processing systems 100 and 900 includes the pre-processor 911, the compressors 912_1-912_3, and the post-processor 926. Compared to the compressors 112_1-112_3 shown in FIG. 1, the compressors 912_1-912_3 shown in FIG. 9 may employ the same compression order (e.g., forward compression order "→"). Compared to the post-processor 126 shown in FIG. 1, the post-processor 926 shown in FIG. 9 may be a de-blocking filter.

Figure 10:
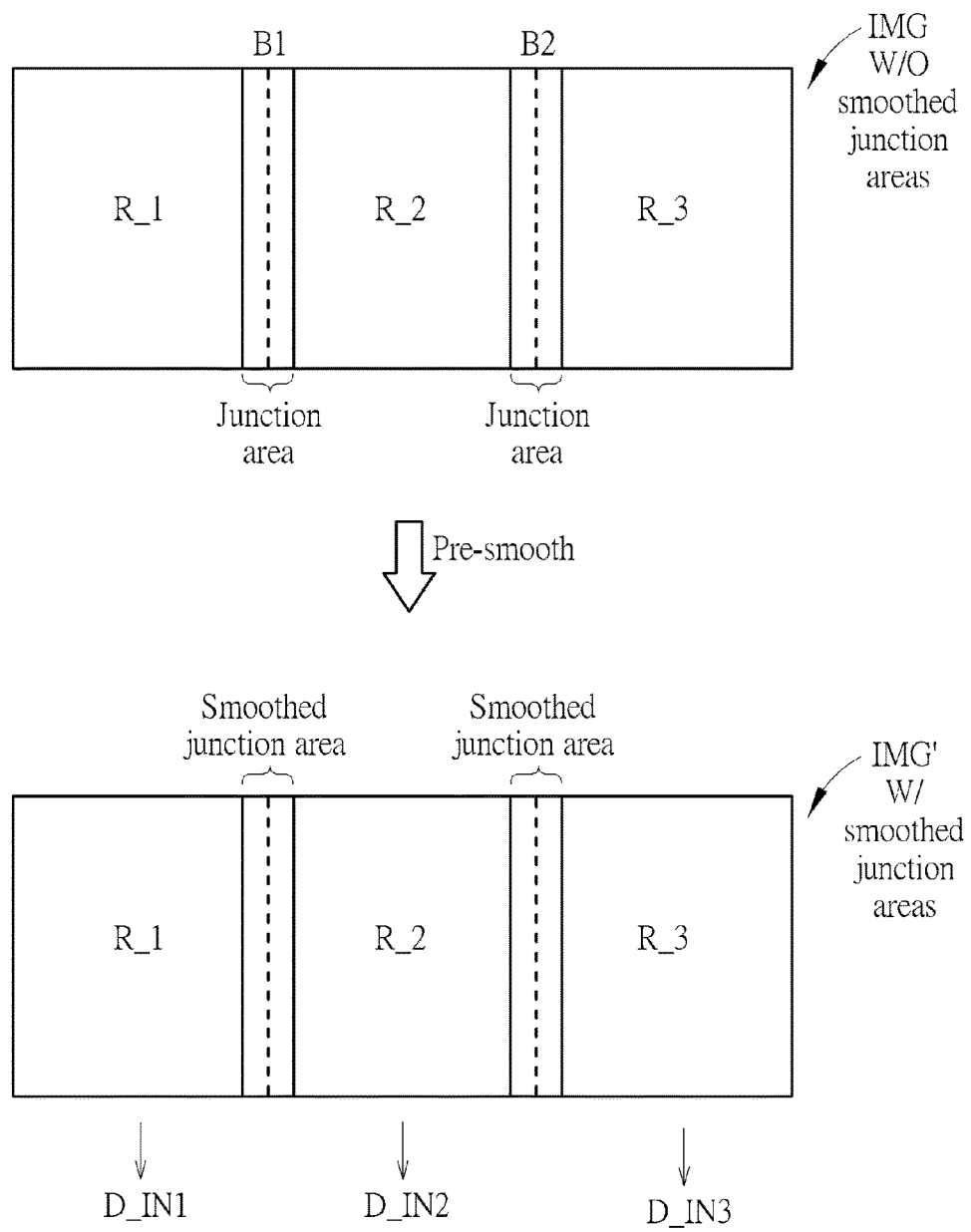
FIG. 10 is a diagram illustrating an example of a pre-smoothing function performed by a pre-processor shown in FIG. 9.

The pre-processor 911 is arranged to perform pre-processing (e.g., pre-smoothing) upon an input frame IMG to generate a pre-processed frame. FIG. 10 is a diagram illustrating an example of a pre-smoothing function performed by the pre-processor 911. The input frame IMG fed into the pre-processor 911 may be divided into three partial regions R_1, R_2, and R_3. The pre-processing includes smoothing one junction area corresponding to the boundary B1 between adjacent partial regions R_1 and R_2 of the input frame IMG, and smoothing the other junction area corresponding to the boundary B2 between adjacent partial regions R_2 and R_3 of the input frame IMG. Hence, the display data D_IN1 generated from the pre-processor 911 to the compressor 912_1 includes display data of the partial region R_1 in the pre-processed frame IMG'. The display data D_IN2 generated from the pre-processor 911 to the compressor 912_2 includes display data of the partial region R_2 in the pre-processed frame IMG'. The display data D_IN3 generated from the pre-processor 911 to the compressor 912_3 includes display data of the partial region R_3 in the pre-processed frame IMG'. Since the junction areas in the input frame IMG is pre-smoothed by the pre-processor 911 before entering the compressors 912_1-912_3 for compression, the junction artifacts introduced due to the display data compression can be reduced to improve the image quality on the display panel 101.

In addition, the pre-processor 911 may be further arranged to control a compression parameter setting of at least one of the compressors 912_1-912_3. For example, the pre-processor 911 may be equipped with the function supported by the aforementioned master compression. As mentioned above, if the compression operation used for generating a compressed display data to be transmitted via one display port of a display interface is blind to the compression operations used for generating compressed display data to be transmitted via other display port(s) of the display interface, junction artifacts may occur on a boundary between adjacent partial display regions. Since the pre-processor 911 is aware of the condition around the boundaries B1 and B2 through a pre-processing result of the input frame IMG, the pre-processor 911 may properly control the at least one of the compressors 912_1-912_3 for achieving better compression quality.

Figure 11:
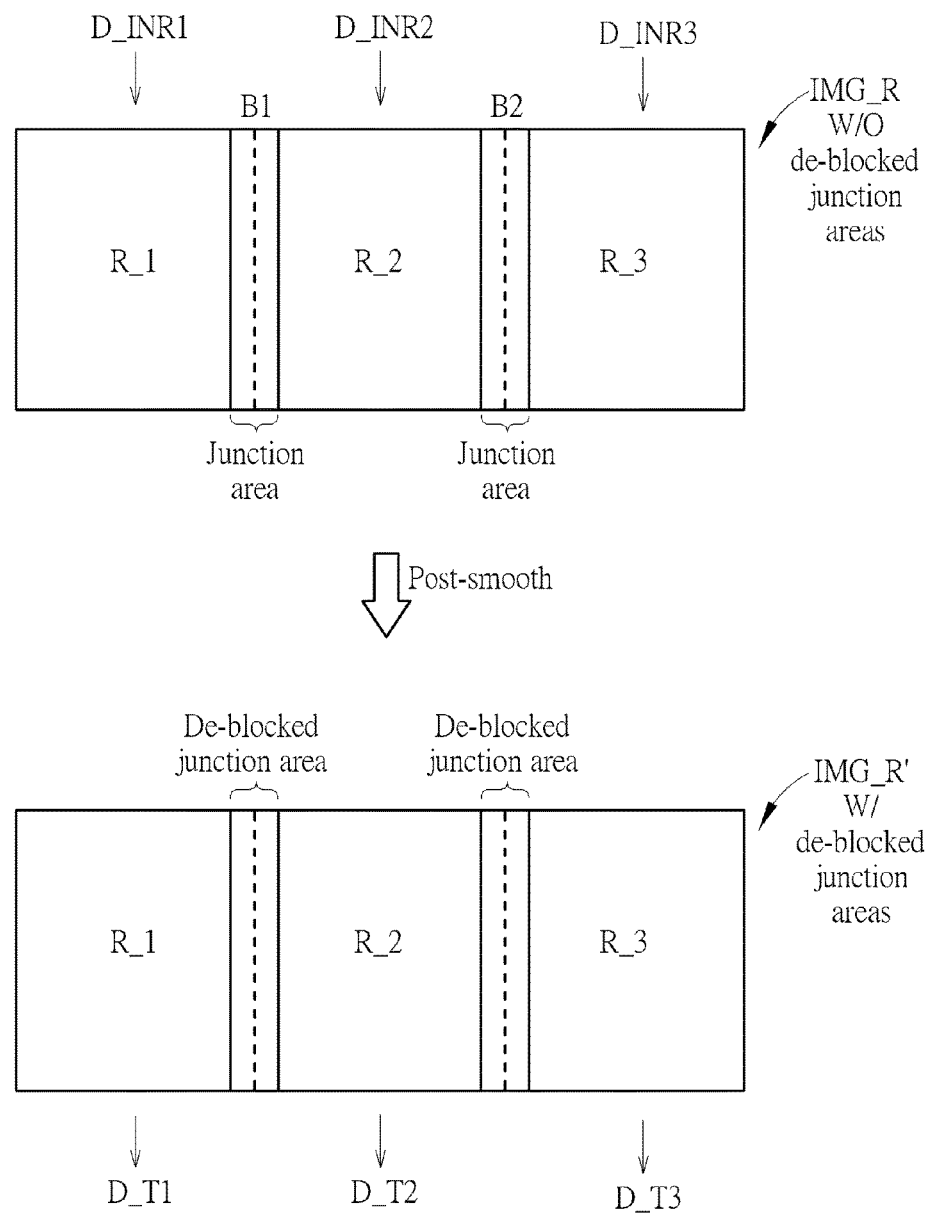
FIG. 11 is a diagram illustrating an example of a post-smoothing function performed by a post-processor shown in FIG. 9.

As shown in FIG. 9, the de-compressed display data D_INR1-D_INR3 generated from the de-compressors 124_1-124_3 are fed into the post-processor 926 to remove potential blocky artifacts. In this embodiment, the post-processor 926 is arranged to perform post-processing upon a reconstructed frame to generate a post-processed frame, where the post-processing includes smoothing junction areas each corresponding to a boundary between adjacent partial regions of the reconstructed frame. For example, the post-processor 926 may apply de-blocking filtering to junction areas in the reconstructed frame. FIG. 11 is a diagram illustrating an example of a post-smoothing function performed by the post-processor 926. The reconstructed frame IMG_R may be divided into three partial regions R_1, R_2, and R_3, where the de-compressed display data D_INR1 generated from the de-compressor 124_1 includes display data of the partial region R_1 in the reconstructed frame IMG_R, the de-compressed display data D_INR2 generated from the de-compressor 124_2 includes display data of the partial region R_2 in the reconstructed frame IMG_R, and the de-compressed display data D_INR3 generated from the de-compressor 124_3 includes display data of the partial region R_3 in the reconstructed frame IMG_R. The post-processor 926 performs a de-blocking filtering operation upon one junction area corresponding to the boundary B1 between adjacent partial regions R_1 and R_2 of the reconstructed frame IMG_R, and further performs a de-blocking filtering operation upon another junction area corresponding to the boundary B2 between adjacent partial regions R_2 and R_3 of the reconstructed frame IMG_R. Hence, the de-compressed display data D_T1 generated from the post-processor 926 includes display data of the partial region R_1 in the post-processed frame IMG_R'; the de-compressed display data D_T2 generated from the post-processor 926 includes display data of the partial region R_2 in the post-processed frame IMG_R'; and the de-compressed display data D_T3 generated from the post-processor 926 includes display data of the partial region R_3 in the post-processed frame IMG_R'. Since the reconstructed frame is post-smoothed by the post-processor 926 before being used to drive the partial display regions A_1-A_3 of the display panel 101, the junction artifacts introduced due to the display data compression can be reduced to improve the image quality on the display panel 101.

Figure 12:
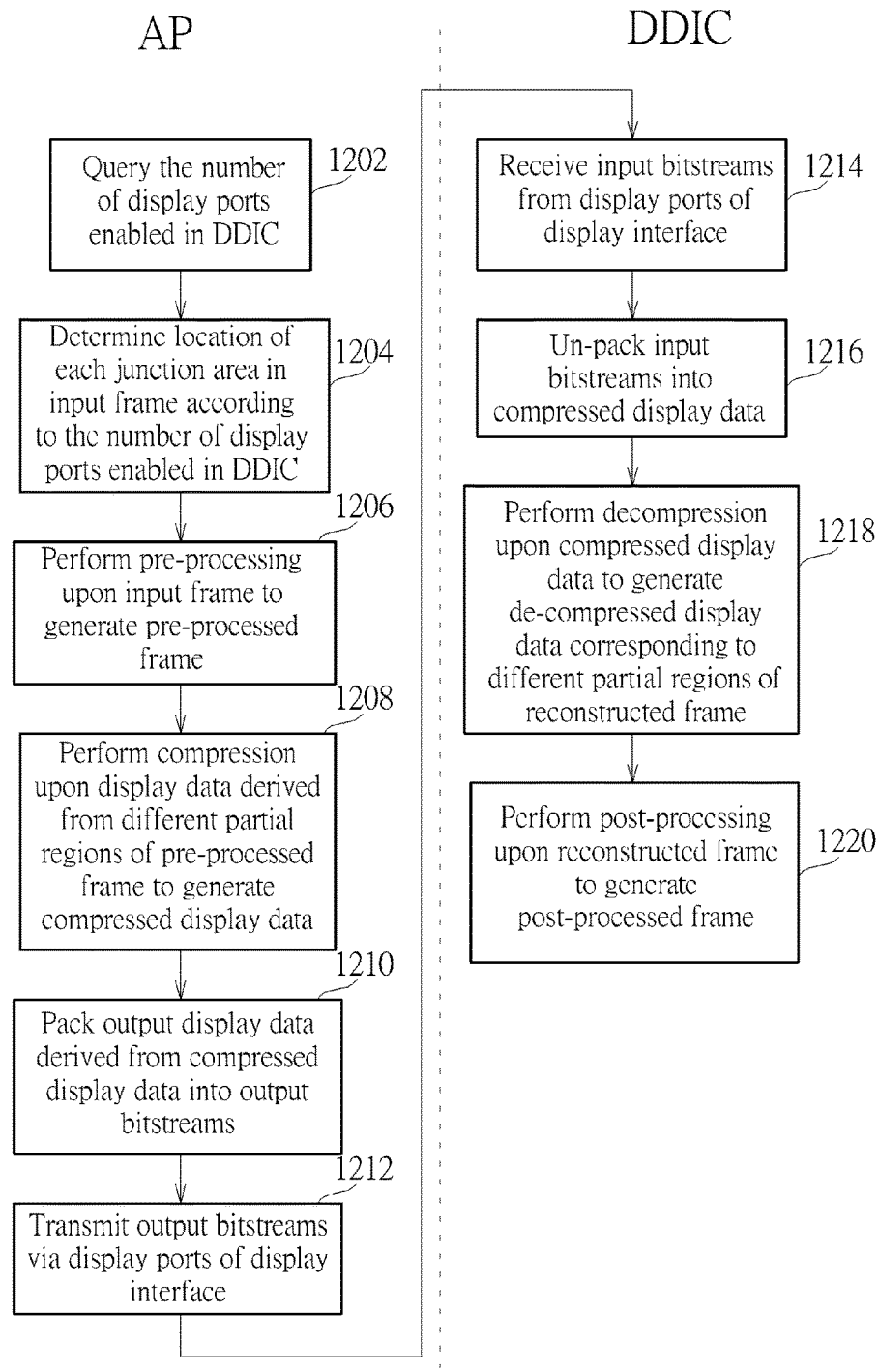
FIG. 12 is a flowchart illustrating yet another data processing method according to an embodiment of the present invention.

FIG. 12 is a flowchart illustrating yet another data processing method according to an embodiment of the present invention. Provided that the result is substantially the same, the steps are not required to be executed in the exact order shown in FIG. 12. The data processing method may be employed by the data processing system 900 shown in FIG. 9, and may be briefly summarized as below.

Step 1202: Query a DDIC for determining the number of display ports enabled in the DDIC.

Step 1204: Determine the location of each junction area in an input frame according to the number of display ports enabled in the DDIC.

Step 1206: Perform pre-processing upon the input frame to generate a pre-processed frame, where the pre-processing includes smoothing a junction area corresponding to a boundary between adjacent partial regions of the input frame.

Step 1208: Perform compression upon a plurality of display data derived from different partial regions of the pre-processed frame to generate a plurality of compressed display data.

Step 1210: Pack a plurality of output display data derived from the plurality of compressed display data into a plurality of output bitstreams, respectively.

Step 1212: Output the output bitstreams via a plurality of display ports of a display interface, respectively.

Step 1214: Receive a plurality of input bitstreams from the display ports of the display interface, respectively.

Step 1216: Un-pack the input bitstreams into a plurality of compressed display data, respectively.

Step 1218: Perform decompression upon the plurality of compressed display data to generate a plurality of de-compressed display data corresponding to different partial regions of a reconstructed frame.

Step 1220: Perform post-processing upon the reconstructed frame to generate a post-processed frame, where the post-processing includes smoothing a junction area corresponding to a boundary between adjacent partial regions of the reconstructed frame.

Steps 1202-1212 are performed at the AP side (i.e., the encoder side), and steps 1214-1220 are performed at the DDIC side (i.e., the decoder side). As a person skilled in the art can readily understand details of each step shown in FIG. 12 after reading above paragraphs, further description is omitted here for brevity.

With regard to the embodiment shown in FIG. 9, one pre-processor 911 is implemented in the AP 902, and one post-processor 926 is implemented in the DDIC 904. However, this is for illustrative purposes only, and is not meant to be a limitation of the present invention. In one alternative design, the pre-processor 911 is modified to omit the pre-processor 911, and the DDIC 904 still has the post-processor 926 implemented therein. In another alternative design, the DDIC 904 is modified to omit the post-processor 926, and the AP 902 still has the pre-processor 911 implemented therein. The same objective of avoiding/mitigating the image quality degradation caused by undesired junction artifacts is achieved. These alternative designs all fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A data processing apparatus comprising:
a first compressor, arranged to generate a first compressed display data by performing compression upon a display data of a first partial region of a frame according to a first compression order;
a second compressor, arranged to generate a second compressed display data by performing compression upon a display data of a second partial region of the frame according to a second compression order, wherein there is a first boundary between the first partial region and the second partial region, and in a horizontal direction, the first compression order on one side of the first boundary is opposite to the second compression order on another side of the first boundary;
a first output interface, arranged to pack a first output display data derived from the first compressed display data into a first output bitstream, and output the first output bitstream via a first display port of a display interface, wherein a first partial display region of a display panel is driven according to the first compressed display data that is included in the first output bitstream transmitted via the first display port; and
a second output interface, arranged to pack a second output display data derived from the second compressed display data into a second output bitstream, and output the second output bitstream via a second display port of the display interface, wherein a second partial display region of the display panel is driven according to the second compressed display data that is included in the second output bitstream transmitted via the second display port, and the first partial display region and the second partial display region are adjacent partial display regions of the display panel.

2. The data processing apparatus of claim 1, wherein the display interface is a display serial interface (DSI) standardized by a Mobile Industry Processor Interface (MIPI) or an embedded display port (eDP) standardized by a Video Electronics Standards Association (VESA).

3. The data processing apparatus of claim 1, further comprising:
a third compressor, arranged to generate a third compressed display data by performing compression upon a display data of a third partial region of the frame according to the second compression order, wherein there is a second boundary between the first partial region and the third partial region, and in the horizontal direction, the first compression order on one side of the second boundary is opposite to the second compression order on another side of the second boundary; and
a third output interface, arranged to pack a third output display data derived from the third compressed display data into a third output bitstream, and output the third output bitstream via a third display port of the display interface.

* * * * *